United States Patent
Machida et al.

(10) Patent No.: US 7,268,568 B2
(45) Date of Patent: Sep. 11, 2007

(54) PROBE CARD

(75) Inventors: Kazumichi Machida, Takarazuka (JP); Atsuo Urata, Ibaraki (JP); Teppei Kimura, Kobe (JP)

(73) Assignee: Nihon Denshizairyo Kabushiki Kaisha, Amagasaki-shi (JP)

( * ) Notice: Subject to any disclaimer, the term of this patent is extended or adjusted under 35 U.S.C. 154(b) by 72 days.

(21) Appl. No.: 11/224,304

(22) Filed: Sep. 13, 2005

(65) Prior Publication Data
US 2007/0052432 A1    Mar. 8, 2007

(51) Int. Cl.
*G01R 31/02*    (2006.01)
(52) U.S. Cl. .................. 324/754; 324/756; 324/757
(58) Field of Classification Search ............ 324/754, 324/756
See application file for complete search history.

(56) References Cited

U.S. PATENT DOCUMENTS

| | | | | |
|---|---|---|---|---|
| 4,788,496 | A * | 11/1988 | Maelzer et al. .......... | 324/754 |
| 4,963,822 | A | 10/1990 | Prokopp .................. | 324/158 P |
| 5,525,911 | A | 6/1996 | Marumo et al. .......... | 324/754 |
| 5,644,249 | A | 7/1997 | Kister ..................... | 324/762 |
| 6,885,204 | B2 * | 4/2005 | Takemoto et al. ........ | 324/754 |
| 6,980,013 | B2 * | 12/2005 | Machida et al. .......... | 324/754 |
| 2002/0024347 | A1 * | 2/2002 | Felici et al. .............. | 324/754 |
| 2004/0124862 | A1 * | 7/2004 | Sugawara ................ | 324/754 |

FOREIGN PATENT DOCUMENTS

JP    11-344509    12/1999

* cited by examiner

*Primary Examiner*—Shuwang Liu
*Assistant Examiner*—Christopher J Von Benken
(74) *Attorney, Agent, or Firm*—Kratz, Quintos & Hanson, LLP

(57) ABSTRACT

The invention aims to provide a vertical type probe card in which a probe can scrape an oxide film on a surface of an electrode of the measurement object, thereby ensuring stable contact with the electrode of the measurement object. A probe card A includes: first and second probes 100a and 100b; a guide substrate 200 in which a plurality of guide holes 210 are formed through which the first and second probes 100a and 100b are inserted in a freely movable manner; a support member 400 provided above the guide substrate 200; a first sheet member 300a of flexibility, attached to the support member 400, having a first electrode pad 310a on its surface, in which a tail end 120a of the first probe 100a projecting out from the guide hole 210 is brought into contact with the first electrode pad 310a; a second sheet member 300b of flexibility, attached to the support member 400, having a second electrode pad 310b on its surface, in which a tail end 120b of the second probe 100b projecting out from the guide hole 210 and penetrating through the first sheet member 300a is brought into contact with the second electrode pad 310b; and vibrating means 500 attached to the support member 400, wherein the vibrating means 500 vibrates the first and second probes 100a and 100b via the support member 400 and the first and second sheet members 300a and 300b.

9 Claims, 6 Drawing Sheets

(a)

200

(b)

(a)

(b)

PROBE CARD

BACKGROUND OF THE INVENTION

Field of the Invention

The present invention relates to a probe card used in measuring electrical characteristics of a semiconductor device to be measured, such as an LSI chip.

As probe cards of this kind, a lateral version called a cantilever type and a stand-up version called a vertical type are known. A typical lateral type probe card has probes attached obliquely to a substrate, and it is not possible to dispose a large number of probes on the substrate. Because of this, probe cards of this type are not suitable in measuring a plurality of targets to be measured (measurement targets) at the same time (multi-chip simultaneous measurement), which has become more common with the recent tendencies of large-scale and high integration of the measurement targets as well as adoption of multi-purpose testers. Accordingly, the lateral type probe cards are used less and less.

On the other hand, a typical vertical type probe card has probes attached to a substrate in a vertical direction, and a large number of probes can be disposed on the substrate. This provides a greater flexibility to probe cards of this type in positioning probes. Accordingly, the vertical type probe cards are a current mainstream, because vertical type probe cards are suitable for simultaneous measurement of a plurality of measurement targets.

In such vertical type probe cards, however, a probe is brought into contact with an electrode of the measurement object in a substantially vertical direction, and a slide distance of the probe to slide sideways on a surface of the electrode of the measurement object becomes shorter (i.e., an amount of scrub is reduced). As a result, it has been difficult to ensure a stable contact between the probe and the electrode of the measurement object, because the probe cannot scrape an oxide film attached on the surface of the electrode of the measurement object while in contact with the electrode.

SUMMARY OF THE INVENTION

The present invention has been made in view of the above circumstances. It is an object of the invention to provide a vertical type probe card having a probe capable of scraping an oxide film on a surface of an electrode of a measurement object, thereby stably contacting with the electrode of the measurement object.

In order to solve the above problems, a probe card of the present invention includes a rectilinear first probe; a guide substrate having an insulating property and formed with a plurality of guide holes through which the first probe is inserted in a freely movable manner; a support member provided in parallel with the guide substrate; a first sheet member of flexibility, attached to the support member to be disposed in parallel with said guide substrate, having a first electrode pad on a surface thereof, in which an end of the first probe projecting out from the guide hole of said guide substrate is brought into contact with said first electrode pad; and vibrating means attached to said support member and vibrating the first probe via said support member and said first sheet member.

In the probe card of this kind, when one end of the first probe is brought into contact with the electrode of the measurement object, the first probe moves within the guide hole of the guide substrate, and then the other end of the first probe projecting out from the guide hole is brought into contact with the first electrode pad on the first sheet member. At this moment, the vibrating means vibrates the first probe via the support member and the first sheet member. By the vibration, the one end of the first probe reciprocates sideways on the electrode of the measurement object and thereby the first probe can scrape the oxide film attached on the surface of the electrode. Therefore, the probe card can achieve stable contact with the electrode of the measurement object.

The probe card may further include a rectilinear second probe inserted through the guide hole of the guide substrate in a freely movable manner; and a second sheet member of flexibility, attached to the support member to be in parallel with and spaced apart from said first sheet member, having a second electrode pad on a surface thereof, in which an end of the second probe projecting out from the guide hole of the guide substrate and penetrating through said first sheet member is brought into contact with the second electrode pad, wherein the vibrating means vibrates the first and second probes via the support member and the first and second sheet members.

In the probe card of this kind, when one end of the first probe and one end of the second probe are brought into contact with electrodes of the measurement object, the other end of the first probe projects out from the guide hole of the guide substrate to be brought into contact with the first electrode pad on the first sheet member while the other end of the second probe projects out from the guide hole of the guide substrate and penetrates through the first sheet member to be brought into contact with the second electrode pad on the second sheet member. At this moment, the vibrating means vibrates the first and second probes via the support member and the first and second sheet members. By the vibration, one end of the first probe and one end of the second probe reciprocate sideways on the respective electrodes of the measurement object and thereby the probes can scrape oxide films attached on surfaces of the electrodes. Therefore, the probe card of this kind can achieve stable contact with the electrodes of the measurement object. In addition, because the first and second electrode pads are arranged at dispersed locations, particularly, on the surfaces of the first and second sheet members, it is possible to prevent congestion of the first and second electrode pads and of wiring patterns due to the congestion of the electrode pads, that could occur with disposition of the probes at a narrow pitch. In this regard, too, the invention will ease arrangement of the probes at a narrow pitch and will be able to adapt for a measurement object having a higher packing density.

The vibrating means preferably has a vibrating frequency from hundreds Hz to hundreds of kHz and an amplitude from 0.5 μm to 50 μm. When vibrating the first and second probes at such a vibrating frequency and amplitude, the oxide film on the surface of the electrode of the measurement object can be preferably scraped. Accordingly, the probe card can contact stably with the electrode of the measurement object.

The guide holes of the guide substrate are preferably formed obliquely relative to a vertical direction. When the guide holes are formed obliquely relative to the vertical direction, the first and second probes inserted in the guide holes are in an obliquely inclined state. Hence, the distal end of a probe is brought into oblique contact with the electrode of the measurement object and slid sideways on the electrode. Hence, an oxide film attached on the electrode can be scraped; therefore, the probe card can contact more stably with the electrode of the measurement object.

It is preferable for the end of the second probe to be sharpened. The sheet member is preferably a liquid crystal polymer or a silicon film, in a mesh or fibrous state. With such a construction, the end of the second probe is easily stick into the first sheet member. Accordingly, it is possible to prevent occurrence of a problem that the second probe cannot penetrate through the first sheet member so that electric contact with the second electrode pad on the second sheet member cannot be ensured. Thus, a merit is enjoyed in ensuring stable contact with the electrode of the measurement object.

Wiring patterns can be provided in the interior of the guide substrate, extended to the guide holes to be brought into contact with the probes. In this case, it is possible to electrically connect with the first and second probes using not only the wiring patterns of the first and second sheet members, but also the wiring patterns in the interior of the guide substrate. Accordingly, the congestion of the wiring patterns that occurs as the probes are disposed at a narrow pitch may be prevented. Therefore, the invention will ease arrangement of the probes at a narrow pitch and will be able to adapt for a measurement object having a higher packing density.

BRIEF DESCRIPTION OF THE DRAWINGS

FIGS. 3A and 3B are views showing a guide substrate of the probe card, wherein FIG. 3A is a schematic plan view and FIG. 3B is a schematic sectional view;

FIGS. 4A and 4B are views showing sheet members for the probe card, wherein FIG. 4A is a schematic plan view and FIG. 4B is a schematic sectional view;

DESCRIPTION OF THE REFERENCE NUMERALS

Figure 1:
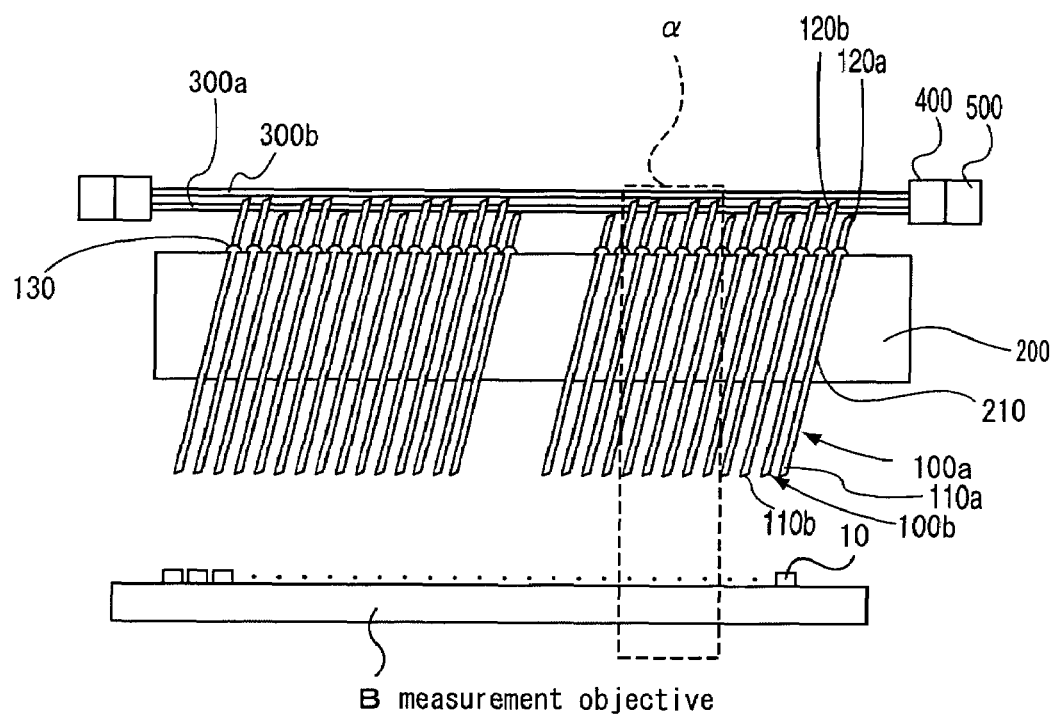
FIG. 1 is a schematic sectional view of a probe card related to a first embodiment of the present invention.

A, A': probe card
100a: first probe
100b: second probe
200: guide substrate
210: guide hole
300a: first sheet member
310a: first electrode pad
300b: second sheet member
310b: second electrode pad
400: support member
500: vibrating means
600a: upper guide substrate
610a: upper guide hole
600b: lower guide substrate
610b: lower guide hole
B: measurement target
10: electrode

DETAILED DESCRIPTION OF THE INVENTION

First of all, a description will be given of a probe card related to a first embodiment of the present invention with reference to the drawings. FIG. 1 is a schematic sectional view of a probe card related to the first embodiment of the present invention, FIG. 2 is an enlarged view of an a portion of the probe card, FIGS. 3A and 3B are views showing a guide substrate of the probe card, wherein FIG. 3A is a schematic plan view and FIG. 3B is a schematic sectional view, and FIGS. 4A and 4B are views showing sheet members for the probe card, wherein FIG. 4A is a schematic plan view and FIG. 4B is a schematic sectional view.

Figure 2:
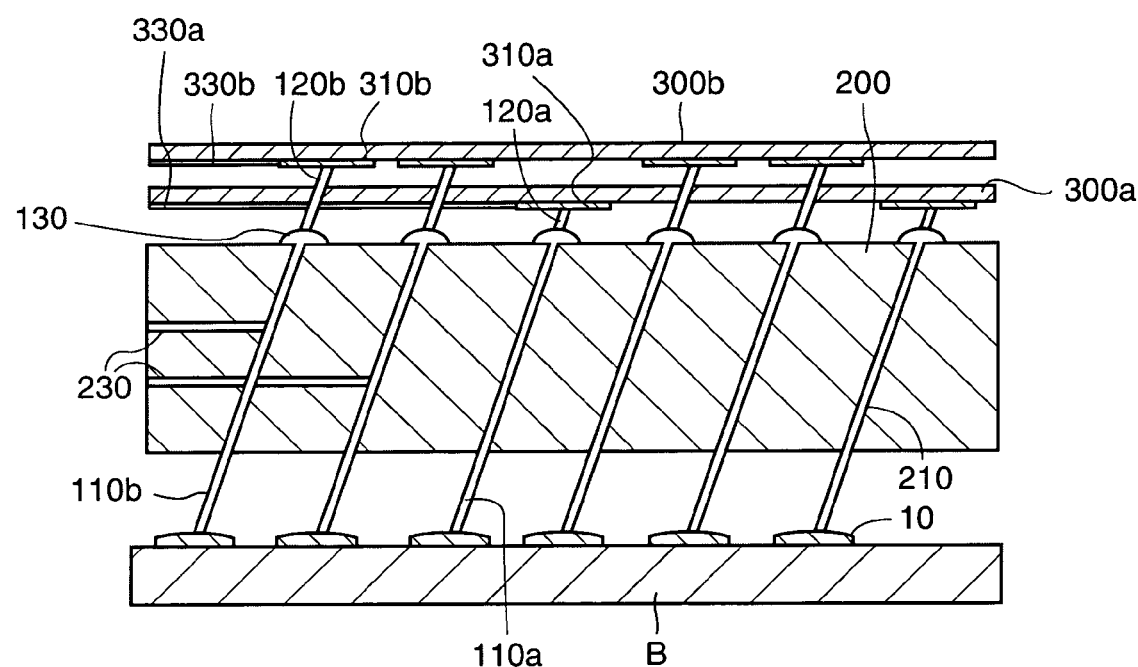
FIG. 2 is an enlarged view of an a portion of the probe card.

The probe card A shown in FIGS. 1 and 2 includes a plurality of rectilinear first and second probes 100a and 100b, a guide substrate 200 in which are formed a plurality of guide holes 210 into which the first and second probes 100a and 100b are inserted in a freely movable manner, a support member 400 disposed above the guide substrate 200, first and second sheet members 300a and 300b each of an insulating property, and disposed in parallel on the support member 400 with a spacing so as not to be in contact with each other, and vibrating means 500 attached to the support member 400. A detailed description will be given of portions thereof below.

The first probe 100a is, as shown in FIGS. 1 and 2, made of an electroconductive material in a cylindrical or band-like shape. The first probe 100a is in the range of 300 µm to 20 mm in length and is longer than the length of the guide holes 210 of the guide substrate 200. A distal end 110a and a tail end 120a of the first probe 100a project out, respectively, from the lower side and upper side of the corresponding guide hole 210 in a state in which the first probe 100a is inserted into the guide hole 210 of the guide substrate 200. The distal end 110a of the first probe 100a is a contact portion contactable with an electrode 10 as a measurement target B, while on the other hand, the tail end 120a thereof is a connecting portion contactable with a first electrode pad 310a on the first sheet member 300a.

The first probe 100a is attached to the upper surface of the guide substrate 200 using an elastic resin 130. In this way, the first probe 100a is attached on the guide substrate 200 using the elastic resin 130. The first probe 100a can be moved in the guide hole 210 of the guide substrate 200 in a freely movable manner and can be prevented from being slipped off from the corresponding guide hole 210.

The second probe 100b is the same as the first probe 100a except that the second probe 100b is slightly longer than the first probe 100a. A distal end 110a of the second probe 100b is a contact portion contactable with the electrode 10 as a measurement target B, while on the other hand, the tail end 120b thereof penetrates through the first sheet member 300a and is a connecting portion contactable with a second electrode pad 310b on the second sheet member 300b.

Figure 3:
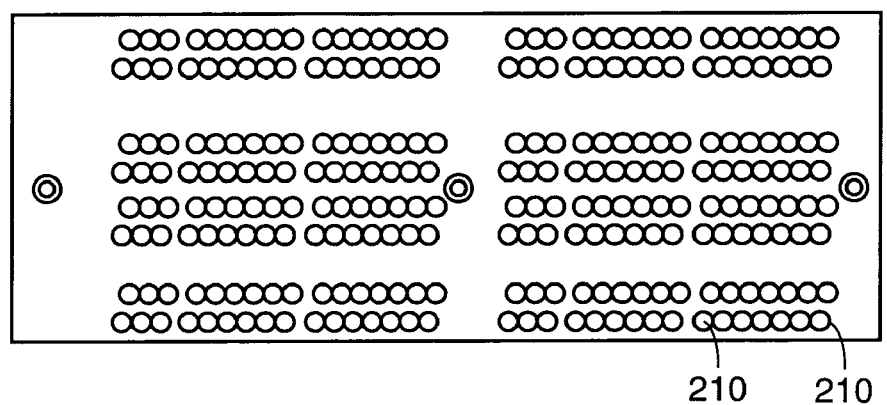
Figure 3:
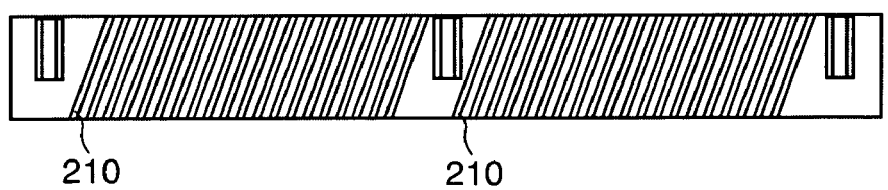

The guide substrate 200 is, as shown in FIGS. 1, 2, and 3, made of a silicon substrate having an insulating property. The guide substrate 200 is in the range of from 500 µm to 1200 µm in thickness. The guide holes 210 are formed in the guide substrate 200 by anisotropic etching with an induction coupling plasma (ICP) method at a pitch in the range of from 70 µm to 100 µm obliquely relative to a vertical direction. A shape of the guide hole 210 is properly selected according to a shape of the probe 100 and a diameter thereof is slightly greater than a diameter of the corresponding probe 100. A length of the guide hole 210 is set so as to be shorter than that of the probe 100. The guide substrate 200 is attached to a reinforcing member.

Wiring patterns 230 and circuit elements connected electrically to the wiring patterns 230 are provided in the interior of the guide substrate 200. One end of the wiring pattern 230 is guided by the guide hole 210 to expose from the guide hole 210 and thereby contactable with the corresponding probe 100, while the other end thereof is connected to an external electrode, not shown, that is provided on a surface of the guide substrate 200. That is, the wiring pattern 230 is connected electrically to a power supply outside the figure through the external electrode.

The circuit element is an element necessary to conduct electric measurement using a probe and, in this case, includes a capacitor functioning as a so-called pass capacitor and a circuit element functioning as a BOST (Build Out Self Test) circuit assisting a test (i.e., measurement of electric characteristics of a measurement target B). The capacitor plays a role to improve high frequency characteristics. The circuit element functioning as a BOST circuit plays a role that alters according to contents of a test on the measurement target B.

The support member 400 is, as shown in FIG. 1, an annular frame in which the first and second sheet members 300a and 300b are disposed one on the other so as not to be in contact with each other. The support member 400 is attached to there in forcing member and is disposed above the guide substrate 200.

Figure 4:
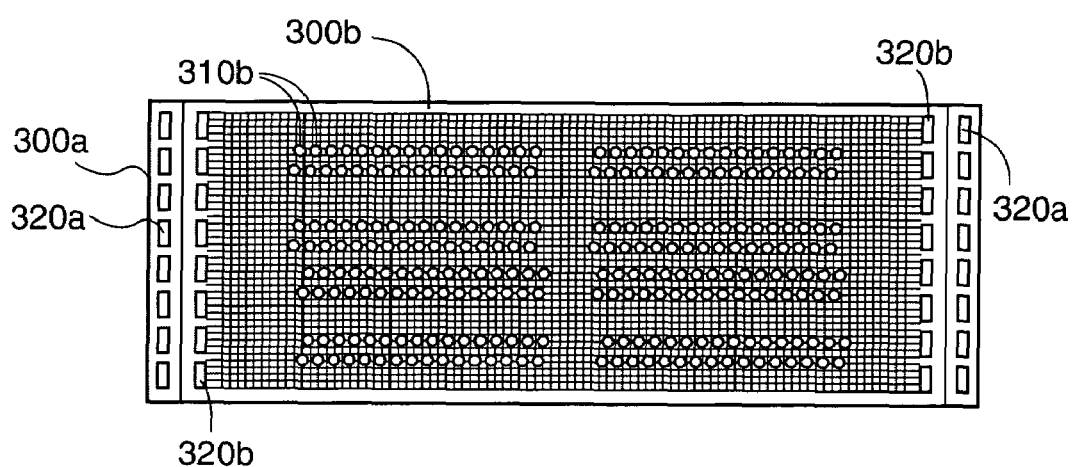
Figure 4:
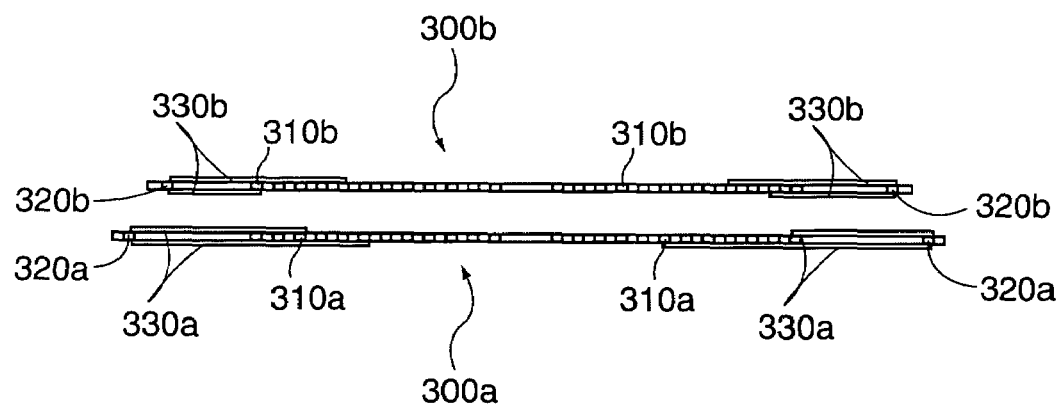

Used as the first and second sheet members 300a and 300b is, as shown in FIGS. 1, 2 and 4, a liquid crystal polymer in a mesh or fibrous state (LCP-Mesh) having apertures each large enough for the probe 100 to penetrate therethrough. On surfaces of the first and second sheet members 300a and 300b, the first and second electrode pads 310a and 310b with which the tail ends 120a and 120b of the first and second probes 100a and 100b are brought into contact, first and second external electrodes 320a and 320b connected electrically to a measuring instrument outside the figure, and first and second wiring patterns 330a and 330b electrically connecting the first and second electrode pads 310a and 310b and first and second external electrodes 320a and 320b, respectively, are provided.

The tail end 120a of the first probe 10a is connected electrically to the measuring instrument through the first wiring pattern 330a and the first external electrode 320a in a state being in contact with first electrode pad 310a on the sheet member 300a. The tail end 120b of the second probe 100b is connected electrically to the measuring instrument through the second wiring pattern 330b and the second external electrode 320b in a state where the tail end 120b thereof penetrates through the first sheet member 300a and is brought into contact with the second electrode pad 310 on the second sheet member 300b. Thus, the second electrode pads 310a and 310b are dispersed over the first and second sheet members 300a and 300b, so that the first and second wiring patterns 330a and 330b can be disposed in high density as the first and second probes 100a and 100b are disposed at a narrower pitch.

The vibrating means 500 is a vibrator having a vibrating frequency of hundreds of Hz to hundreds of kHz and an amplitude of 0.5 μm to 50 μm. The vibrating means 500 is attached to the outer surface of the support member 400.

Such a probe card A is assembled in the following manner. First of all, the first and second probes 100a and 100b are inserted into the guide holes 210 of the guide substrate 200 and attached to the upper surface of the guide substrate 200 with the elastic resin 130. Then, the first and second probes 100a and 100b are, as shown in FIG. 1, in a state where they are inclined obliquely relative to a vertical direction.

Then, the first and second sheet members 300a and 300b are disposed on the support member 400 one on the other so as not to be in contact with each other. The vibrating means 500 is attached to the support member 400. The guide substrate 200 attached with the first and second probes 100a and 100b and the support member 400 attached with the first and second sheet members 300a and 300b are disposed on the reinforcing member. The first and second sheet members 300a and 300b are arranged in parallel with the guide substrate 200.

The probe card A with such a construction is mounted to a prober of the measuring instrument and is used in measurement of electric characteristics of the measurement target B. Detailed description of a usage method thereof will be given below.

First of all, the vibrating means 500 is operated. A driving apparatus of the prober is activated to move the probe card A and the measurement target B relatively toward each other. With the movement, the distal ends 100a and 100b of the first and second probes 100a and 100b are brought into contact with the electrode 10 of the measurement target B. Thereafter, the probe card A and the measurement target B are moved closer to each other so as to cause the distal ends 110a and 100b of the first and second probes 100a and 100b to press against the electrode 10 of the measurement target B (that is, overdriven).

In the course of this operation, the first probe 100a moves through the guide hole 210 of the guide substrate 200 and the tail end 120b of the first probe 100a is brought into contact with the first electrode pad 310a on the first sheet member 300a. On the other hand, the second probe 100b moves through the guide hole 210 of the guide substrate 200 and the tail end 120b of the second probe 100b penetrates through the first sheet member 300a and is brought into contact with the second electrode pad 310b on the second sheet member 300b.

When the tail ends 120a and 120b of the first and second probes 100a and 100b are brought into contact with the first and second electrode pads 310a and 310b on the first and second sheet members 300a and 300b, the first and second electrode pads 310a and 310b are displaced in an upper direction. The portions forming the first and second electrode pads 310a and 310b on the first and second sheet members 300a and 300b and the portions therearound are elastically deformed in an upper direction. With such action, not only is a shock caused by the overdriving absorbed, but a predetermined contact pressure is secured between the distal ends 110 of the first and second probes 100 and the corresponding electrodes 10 of the measurement target B.

At this time, the vibrating means 500 vibrates the support member 400 and the first and second sheet members 300a and 300b. The vibration of the first and second sheet members 300a and 300b moves the first and second electrode pads 310a and 310b up and down. By this, the first and second probes 100a and 100b are moved up and down repetitively. The distal ends 110a and 110b of the first and second probes 100a and 100b are repetitively slid sideways on surfaces of the electrodes 10 as the measurement target B. In the course of this operation, the distal ends 110a and 110b of the first and second probes 100a and 100b scrape oxide films attached on the electrodes 10 as the measurement target B. By this, a stable contact can be secured between the distal ends 110a and 110b of the first and second probes 100a and 100b and the electrodes 10 as the measurement target B, and the measuring instrument measures electric characteristics of the measurement target B.

In a case where such a probe card A is employed, the first and second probes 100a and 100b are brought into contact with the first and second electrode pads 310a and 310b on the first and second sheet members 300a and 300b. The portions forming the first and second electrode pads 310a and 310b on the first and second sheet members 300a and 300b and the portions therearound are elastically deformed in an upper direction. A predetermined contact pressure can be secured between the first and second probes 100a and 100b and the electrodes 10 as the measurement target B. The vibrating means 500 vibrates the first and second probes 100a and 100b via the support member 400 and the first and second sheet members 300a and 300b. The distal ends 110a and 110b of the first and second probes 100a and 100b are reciprocated sideways on the electrodes 10 as the measurement target B. The distal ends 110a and 110b of the first and second probes 100a and 100b can scrape oxide films attached on surfaces of the electrodes 10. Thus, the probe card A can ensure stable contact with the electrode 10 as the measurement target B.

In the probe card A, the wiring patterns necessary for electric connection of the first and second probes 100a and 100b are dispersed over the guide substrate 200 and the first and second sheet members 300a and 300b, and thus, it is possible to adapt for a higher complexity in an integrated circuit as a measurement target B.

Figure 5:
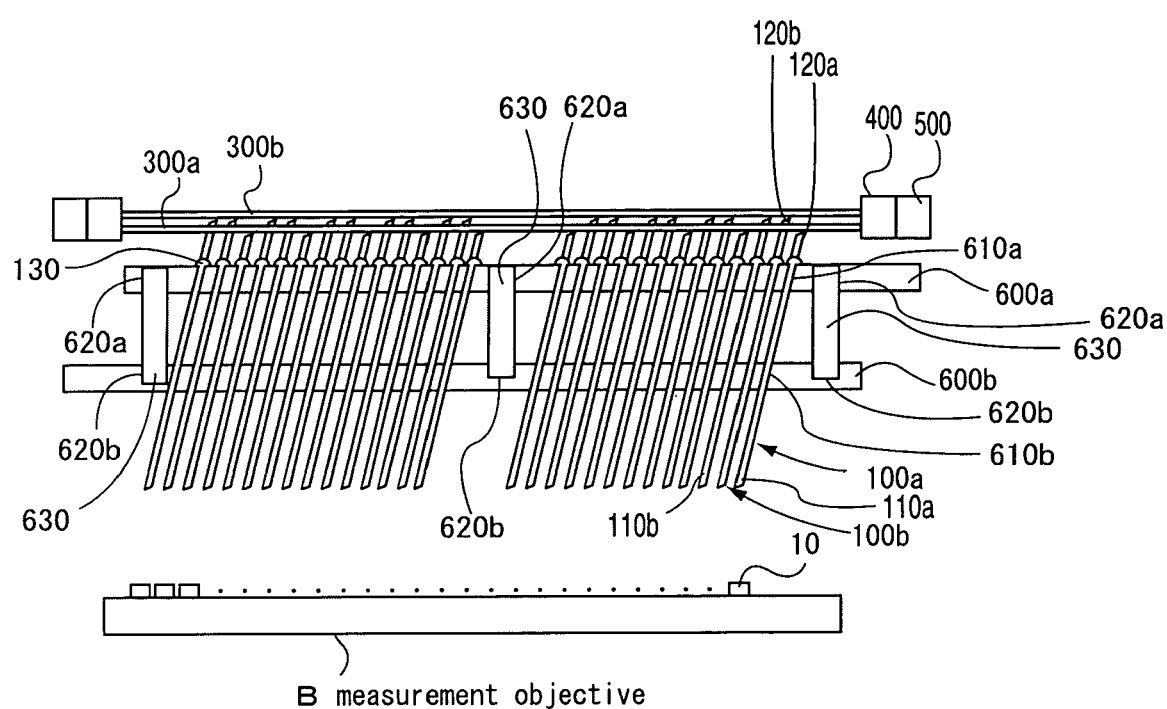
FIG. 5 is a schematic sectional view of a probe card related to a second embodiment of the present invention.
Figure 6:
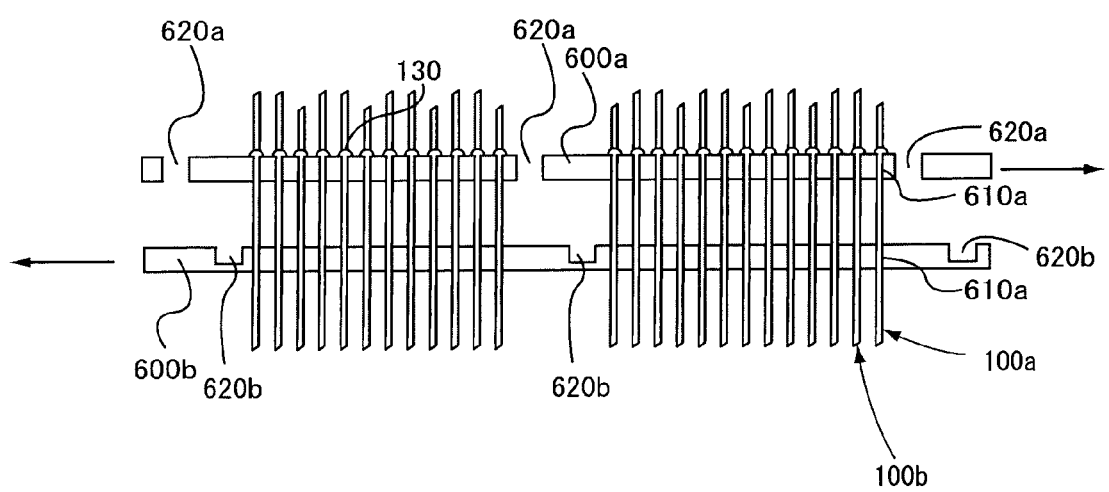
FIG. 6 is a schematic sectional view showing an attaching process for probes of the probe card.

A description of a probe card related to the second embodiment of the present invention will be given with reference to the accompanying drawings. FIG. 5 is a schematic sectional view of a probe card related to a second embodiment of the present invention, and FIG. 6 is a schematic sectional view showing an attaching process for probes of the probe card.

The probe card A' shown in FIG. 5 is almost the same construction as that of the probe card A. The probe card A' is different from the probe card A in that an upper guide substrate 600a and a lower guide substrate 600b are employed instead of the guide substrate 200. Therefore, a detailed description will be given to the differences of the construction, and an explanation about the same parts is not given here. Note that the same symbols as in Embodiment 1 are used to indicate the same members.

A silicon substrate similar to the guide substrate 200 is employed as the upper guide substrate 600a. The upper guide substrate 600a is different from the guide substrate 200 in that a thickness of the upper guide substrate 600a is in the range of 100 mm to 6 mm and thinner than the guide substrate 200. Therefore, none of wiring patterns and circuit elements is provided in the interior of the upper guide substrate 600a. An upper guide hole 610a of the upper guide substrate 600a is formed vertically at a pitch in the range of from 70 μm to 100 μm. Mounting holes 620a each of which is an internally threaded through hole, into which support poles 630 are inserted are formed at both end portions and a central portion of an upper surface of the upper guide substrate 600a. Note that the first and second probes 100a and 100b are attached to the upper surface of the upper guide substrate 600a with the elastic resin 130.

Used as the lower guide substrate 600b is a silicon substrate almost same as the upper guide substrate 600a. The lower guide substrate 600b is different from the upper guide substrate 600a in that mounting holes 620b each are not a through hole but an internally threaded hole with a bottom and that the mounting holes 620b are provided at positions shifted in position from the upper guide holes 610a of the upper guide substrate 600a while not aligning with a vertical line as shown in FIG. 6.

Such a probe card A' is assembled in the following way. First of all, as shown in FIG. 6, the upper guide substrate 600a and the lower guide substrate 600b are positioned so as to face each other. In this step, the upper guide hole 610a of the upper guide substrate 600a and the lower guide hole 610b of the lower guide substrate 600b are positioned so as to be on vertical lines. Thereafter, the first and second probes 100a and 100b are inserted into the upper guide hole 610a of the upper guide substrate 600a and the lower guide hole 610b of the lower guide substrate 600b, and attached to the upper surface of the upper guide substrate 600a with the elastic resin 130. Then, the upper guide substrate 600a is moved horizontally in a direction of an arrow symbol of FIG. 6 (in a rightward direction) while on the other hand, the lower guide substrate 600b is moved horizontally in a direction of an arrow symbol of FIG. 6 (in a leftward direction) Thereafter, the mounting hole 620a of the upper guide substrate 600a and the mounting hole 620b of the lower guide substrate 600b are positioned on a vertical line. The first and second probes 100a and 100b are, as shown in FIG. 5, in a state of being inclined obliquely relative to a vertical direction. The support poles 630 are inserted into the mounting holes 620a and 620b to be hinged.

The first and second sheet members 300a and 300b are disposed on the support member 400 one on the other so as not to be in contact with each other. The vibrating means 500 is attached to the support member 400. Then, the upper guide substrate 600a and the lower guide substrate 600b attached with the first and second probes 100a and 100b and the support member 400 attached with the first and second sheet members 300a and 300b are disposed on the reinforcing member. By thus, the first and second sheet members 300a and 300b are disposed in parallel with the upper guide substrate 600a and the lower guide substrate 600b.

The probe card A' thus assembled is mounted to the prober of the measuring instrument and used to measure electric characteristics of the measurement target B. Detailed description of a usage method thereof will be given below.

First of all, the vibrating means 500 is operated. The driving apparatus of the prober is activated and the probe card A and the measurement target B are moved relatively toward each other. By the movement, the distal ends 110a and 100b of the first and second probes 100a and 100b are brought into contact with the electrodes 10 as the measurement target B. Thereafter, the probe card A is moved closer to the measurement target B to press the distal ends 110a and 100b of the first and second probes 100a and 100b against the electrodes 10 as the measurement target B (that is, overdriven).

In the course of this operation, the first probe 100a moves through the upper guide hole 610a of the upper guide substrate 600a and the lower guide hole 610b of the lower guide substrate 600b and the tail end 120b of the first probe 100a is brought into contact with the first electrode pad 310a on the first sheet member 300a. On the other hand, the second probe 100b moves through the upper guide hole 610a of the upper guide substrate 600a and the lower guide hole 610b of the lower guide substrate 600b and the tail end 120b of the second probe 100b penetrates through the first sheet member 300a and is brought into contact with the second electrode pad 310b on the second sheet member 300b.

When the tail ends 120a and 120b of the first and second probes 100a and 100b are brought into contact with the first and second electrode pads 310a and 310b on the first and second sheet members 300a and 300b, the first and second electrode pads 310a and 310b are displaced in an upper direction. The portions forming the first and second electrode pads 310a and 310b on the first and second sheet members 300a and 300b and the portions therearound are elastically deformed in an upper direction. With such workings exerted, not only is a shock caused by the overdriving absorbed, but a predetermined contact pressure is secured between the distal ends 110 of the first and second probes 100 and the electrodes 10 as the measurement target B.

The vibrating means 500 vibrates the support member 400 and the first and second sheet members 300a and 300b. The vibration of the first and second sheet members 300a and 300b moves the first and second electrode pads 310a and 310b up and down. The first and second probes 100a and 100b are repetitively moved up and down. The distal ends 110a and 110b of the first and second probes 100a and 100b are repetitively slid sideways on surfaces of the electrodes 10 as the measurement target B. In the course of this operation, the distal ends 110a and 110b of the first and second probes 100a and 100b scrape oxide films attached on the electrodes 10 as the measurement target B. A stable contact can be secured between the distal ends 110a and 110b of the first and second probes 100a and 100b and the electrodes 10 as the measurement target B. The measuring instrument measures electric characteristics of the measurement target B.

In a case where such a probe card A' is employed, the same effect as that of the probe card A is exerted. The first and second probes 100a and 100b are inserted into the upper guide hole 610a and the lower guide hole 610b in a state where the upper guide hole 610a of the upper guide substrate 600a and the lower guide hole 610b of the lower guide substrate 600b are positioned on the vertical lines. Thereafter, the upper guide substrate 600a and the lower guide substrate 600b are horizontally moved in the direction opposite to each other. The first and second probes 100a and 100b can be in a state being obliquely inclined. Attaching of the first and second probes 100a and 100b can be easy.

Any change in design of the probe cards A and A' may be conducted without causing any inconvenience, as far as the probe cards A and A' include: a rectilinear first probe; a guide substrate having an insulating property, in which a plurality of guide holes are formed through which the first probe is inserted in a freely movable manner; a support member provided in parallel with the guide substrate; a first sheet member of flexibility, attached to the support member to be disposed in parallel with the guide substrate, having a first electrode pad on its surface, in which the end of the first probe projecting out from the guide hole of the guide substrate is brought into contact with the first electrode pad; and vibrating means attached to the support member and vibrating the first probe via the support member and the first sheet member.

As the first and second probes 100a and 100b, the probe cards A and A' may have the first probe 100a. In this case, the second sheet member 300b is unnecessary. The first and second probes 100a and 100b each are of a cylindrical or band-like shape. Any shape may be used as far as the first and second probes 100a and 100b are rectilinear. While the elastic resin 130 is employed as a slip-off proof means of each of the first and second probes 100a and 100b, any material may be employed as far as a similar function can be realized.

While the first and second sheet members 300a and 300b are liquid crystal polymers in a mesh or fibrous state, the first and second sheet members 300a and 300b are not limited to the liquid crystal polymers, but any material may be used instead as far as a similar function can be realized. For example, a silicon film or the like can replace the liquid crystal polymers. In this case, the tail ends 120a and 120b of the first and second probes 100a and 100b are preferably sharpened. While the two sheet members are employed, needless to say that three or more sheet members can be employed laminating them so as not to be in contact with one another. In this case, the probe cards A and A' each are provided with the following third probe. The end of the third probe projecting out from the guide hole of the guide substrate penetrates through two or more sheet members including the lowermost sheet member sequentially from the bottom so as to be brought into contact with an electrode pad on a sheet member above the uppermost sheet member of the penetrated sheet members. Three or more sheet members are used to disperse the wiring patterns provided on their surfaces, thereby enabling adaptation for a high complexity in an integrated circuit as a measurement target.

While the guide substrate 200 is a silicon substrate, the guide substrate 200 is not specifically limited to the silicon substrate. While the guide holes 210 are formed obliquely relative to a vertical direction, they may be formed in conformity with a vertical direction. While the wiring patterns 230 and circuit elements are provided in the interior of the guide substrate 200, the presence or absence thereof is arbitrary. Note that the wiring patterns 230 can be also naturally used as a line with which transmission and reception of a test signal are conducted. In this case, the electrode pads 310 can be used only as receiving members.

A silicon substrate is not necessary used as the upper guide substrate 600a and the lower guide substrate 600b and any of other substrates can be used as far as a similar function can be realized. While no wiring pattern is provided in the interior of the upper guide substrate 600a and the lower guide substrate 600b, wiring patterns can be naturally provided in the interior thereof if the plates have a thickness of a predetermined value or more. Note that in Embodiment 2, employed are two guide substrates including the upper guide substrate 600a and the lower guide substrate 600b, needless to say that it is possible to employ three or more guide substrates disposed one on another.

While the upper guide hole 610a and the lower guide hole 610b are formed along a vertical direction, it is naturally possible to form the guide holes 610a and 610b obliquely relative to a vertical direction as in the guide holes 210.

The support member 400 is an annular frame. However, any material may be used as far as the first and second sheet members 300a and 300b can be disposed one on the other so as not to be in contact with each other. For instance, a pair of support members may grasp both ends of the first and second sheet members 300a and 300b.

The vibrating means 500 is a vibrator. Any means which can vibrate the first and second probes 100a and 100b via the support member 400 and the first and second sheet members 300a and 300b may be used. A vibrating frequency and an amplitude of the vibrating means 500 are properly selected according to the quality of the probes and the mounting angle of the probes, needless to say that a vibrating frequency and an amplitude of the vibrating means 500 are not limited to the above embodiments.

What is claimed is:

1. A probe card comprising:
a plurality of rectilinear first probes;
a guide substrate having an insulating property and formed with a plurality of guide holes through which the first probes are inserted in a freely movable manner;
a first sheet member of flexibility, disposed in parallel with and spaced apart from said guide substrate, having a plurality of first electrode pads on a surface thereof, in which ends of the first probes projecting out from the guide holes of said guide substrate are brought into contact with said first electrode pads; and
vibrating means for vibrating the first probes via said first sheet member.

2. A probe card according to claim 1, further comprising:
a plurality of rectilinear second probe probes inserted through the guide holes of said guide substrate in a freely movable manner; and
a second sheet member of flexibility, disposed in parallel with and spaced apart from said first sheet member, having a plurality of second electrode pads on a surface thereof, in which ends of the second probes projecting out from the guide holes of said guide substrate and penetrating through said first sheet member are brought into contact with the second electrode pads,
wherein said vibrating means vibrates the first and second probes via the first and second sheet members.

3. A probe card according to claim 1 or claim 2 wherein said vibrating means has a vibrating frequency from hundreds of Hz to hundreds of kHz and an amplitude from 0.5 μm to 50 μm.

4. A probe card according to claim 1 or claim 2 wherein the guide holes of said guide substrate are formed obliquely relative to a vertical direction.

5. A probe card according to claim 2, wherein the ends of said second probes for piercing the first sheet member are sharpened.

6. A probe card according to claim 1 wherein said first sheet member is one of a liquid crystal polymer in a mesh state, a liquid crystal polymer in a fibrous state, a silicon film in a mesh state and a silicon film in a fibrous state.

7. A probe card according to claim 1 wherein wiring patterns are provided in the interior of said guide substrate, the wiring patterns being guided to said guide holes and capable of contacting with said first probes.

8. A probe card according to claim 2, wherein said second sheet member is one of a liquid crystal polymer in a mesh state, a liquid crystal polymer in a fibrous state, a silicon film in a mesh state and a silicon film in a fibrous state.

9. A probe card according to claim 2, wherein wiring patterns are provided in the interior of said guide substrate, the wiring patterns being guided to said guide holes and capable of contacting with said second probes.

* * * * *